United States Patent
Ito et al.

(10) Patent No.: US 8,921,877 B2
(45) Date of Patent: *Dec. 30, 2014

(54) SEMICONDUCTOR LIGHT-EMITTING DEVICE FOR PRODUCING WAVELENGTH-CONVERTED LIGHT AND METHOD FOR MANUFACTURING THE SAME

(75) Inventors: Kosaburo Ito, Tokyo (JP); Toshihiro Seko, Tokyo (JP); Kazuhiko Ueno, Tokyo (JP); Naoto Suzuki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 544 days.

This patent is subject to a terminal disclaimer.

(21) Appl. No.: 13/196,868

(22) Filed: Aug. 2, 2011

(65) Prior Publication Data

US 2012/0025218 A1  Feb. 2, 2012

(30) Foreign Application Priority Data

Aug. 2, 2010 (JP) ................................. 2010-173852

(51) Int. Cl.
*H01L 33/00* (2010.01)
*H01L 33/50* (2010.01)
*H01L 33/48* (2010.01)

(52) U.S. Cl.
CPC .............. *H01L 33/505* (2013.01); *H01L 33/48* (2013.01); *H01L 2933/0041* (2013.01); *H01L 2224/73253* (2013.01)
USPC ........ 257/98; 257/99; 257/100; 257/E33.059; 257/E33.067

(58) Field of Classification Search
USPC ................. 257/98, 99, 10, E33.056, E33.059
See application file for complete search history.

(56) References Cited

U.S. PATENT DOCUMENTS 7,078,732 B1  7/2006  Reeh et al.
7,679,100 B2  3/2010  Schwenkschuster et al.

(Continued)

FOREIGN PATENT DOCUMENTS

EP     1 189 291 A2    3/2002
JP     10-151794 A     6/1998

(Continued)

OTHER PUBLICATIONS

List of Potentially Related Pending Applications citing U.S. Appl. No. 13/355,754 to Takeshi Waragawa et al. filed Jan. 23, 2012.

(Continued)

*Primary Examiner* — Jesse Y Miyoshi
(74) *Attorney, Agent, or Firm* — Kenealy Vaidya LLP

(57) ABSTRACT

A semiconductor light-emitting device and a method for manufacturing the same can include a wavelength converting layer located on at least one semiconductor light-emitting chip in order to emit various colored lights including white light. The semiconductor light-emitting device can include a base board, the chip mounted on the base board and a transparent plate disposed on the wavelength converting layer including a spacer and a phosphor having a high density. The wavelength converting layer can be formed in a thin uniform thickness between the transparent plate and a top surface of the chip using the spacer so as to extend toward the transparent plate. The semiconductor light-emitting device can be configured to improve light-emitting efficiency of the chip by using the thin wavelength converting layer including the phosphor having a high density, and therefore can emit a wavelength-converted light having a high light-emitting efficiency from a small light-emitting surface.

19 Claims, 11 Drawing Sheets

(56) References Cited

U.S. PATENT DOCUMENTS

| | | | |
|---|---|---|---|
| 8,251,560 | B2 | 8/2012 | Ohno et al. |
| 8,338,846 | B2 * | 12/2012 | De Graaf et al. ............... 257/98 |
| 8,461,610 | B2 | 6/2013 | Ito et al. |
| 8,482,191 | B2 * | 7/2013 | Berben et al. ................ 313/502 |
| 2004/0104391 | A1 * | 6/2004 | Maeda et al. .................. 257/79 |
| 2006/0022211 | A1 | 2/2006 | Yatsuda et al. |
| 2006/0261364 | A1 * | 11/2006 | Suehiro et al. ................ 257/100 |
| 2007/0086148 | A1 | 4/2007 | Schwenkschuster et al. |
| 2008/0054279 | A1 | 3/2008 | Hussell et al. |
| 2009/0001490 | A1 | 1/2009 | Bogner et al. |
| 2009/0134417 | A1 | 5/2009 | Sato et al. |
| 2009/0159912 | A1 | 6/2009 | Engl et al. |
| 2010/0163892 | A1 * | 7/2010 | Liu ................................. 257/89 |
| 2011/0180822 | A1 | 7/2011 | Ruhnau et al. |
| 2012/0025218 | A1 | 2/2012 | Ito et al. |
| 2012/0320617 | A1 | 12/2012 | Ohno et al. |

FOREIGN PATENT DOCUMENTS

| | | | |
|---|---|---|---|
| JP | 11-340515 | A | 12/1999 |
| JP | 2004-31989 | A | 1/2004 |
| JP | 2004-40099 | A | 2/2004 |
| JP | 2005-330459 | A | 12/2005 |
| JP | 2006-37097 | A | 2/2006 |
| JP | 2006-48934 | A | 2/2006 |
| JP | 2007-103901 | A | 4/2007 |
| JP | 2007-103937 | A | 4/2007 |
| JP | 2008-47906 | A | 2/2008 |
| JP | 2008-507850 | A | 3/2008 |
| JP | 2008-103688 | A | 5/2008 |
| JP | 2009-135136 | A | 6/2009 |
| JP | 2009-526377 | A | 7/2009 |
| JP | 2009-182241 | A | 8/2009 |
| JP | 2009-218274 | A | 9/2009 |
| JP | 2010-118531 | A | 5/2010 |
| JP | 2010-272847 | A | 12/2010 |
| JP | 2013-38187 | A | 2/2013 |
| WO | 2007/119782 | A1 | 10/2007 |
| WO | 2007/146860 | A1 | 12/2007 |
| WO | 2008/078235 | A3 | 7/2008 |
| WO | 2010/001306 | A1 | 1/2010 |
| WO | 2010/017831 | A1 | 2/2010 |
| WO | WO 2010/017831 | * | 2/2010 |

OTHER PUBLICATIONS

List of Potentially Related Pending U.S. Appl. No. 14/163,992 to Kosaburo Ito filed Jan. 24, 2014.
List of Potentially Related Pending U.S. Patent Applications citing U.S. Appl. No. 13/162,151 to Kosaburo Ito et al. Filed Jun. 16, 2011.
List of Potentially Related Pending U.S. Appl. No. 13/325,038 to Takeshi Waragawa et al. filed Dec. 13, 2011.
Japanese Office Action for the related Japanese Patent Application No. 2010-173852 dated Jan. 8, 2014.
List of Potentially Related Pending U.S. Patent Applications citing U.S. Appl. No. 13/162,151 to Kosaburo Ito et al. filed Jun. 16, 2011, and U.S. Appl. No. 13/229,663 to Seko et al. filed Sep. 9, 2011.
Japanese Office Action for the related Japanese Patent Application No. 2010-173852 dated Jun. 9, 2014.

* cited by examiner

SEMICONDUCTOR LIGHT-EMITTING DEVICE FOR PRODUCING WAVELENGTH-CONVERTED LIGHT AND METHOD FOR MANUFACTURING THE SAME

This application claims the priority benefit under 35 U.S.C. §119 of Japanese Patent Application No. 2010-173852 filed on Aug. 2, 2010, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength converting layer, and to manufacturing methods for the same. More particularly, the disclosed subject matter relates to semiconductor light-emitting devices for a vehicle light and the like, which can emit light having a high light-emitting efficiency from a small light-emitting surface via a thin wavelength converting layer including a high density of phosphor, and to methods of manufacturing such devices, which can emit a wavelength-converted light having a similar chromaticity even between different manufacturing lots.

2. Description of the Related Art

Semiconductor light-emitting devices, in which a part of the light emitted from a semiconductor light-emitting chip is converted into light having a different wavelength by a phosphor and in which a mixture light comprising the light having the different wavelength mixed with the light emitted directly from the light-emitting chip is emitted, have been used as a light source for various lighting units. Forming a wavelength converting layer for the semiconductor light-emitting devices has been achieved by use of various methods such as applying a transparent resin including a phosphor on a top surface of the semiconductor light-emitting chip, printing a transparent resin on the top surface of the light-emitting chip, and dispensing a transparent resin in a cavity for mounting a light-emitting chip.

A first conventional semiconductor light-emitting device including a wavelength-converting layer in a cavity, for example, is disclosed in Patent Document No. 1 (Japanese Patent Application Laid Open JP2006-48934). FIG. 9 is a side cross-section view showing the first conventional semiconductor light-emitting device including the wavelength converting layer disposed in the cavity for mounting a plurality of semiconductor light-emitting chips therein, which is disclosed in Patent Document No. 1.

The conventional semiconductor light-emitting device 20 includes: a casing 23 having a cavity 23a that includes a substantially rectangular opening and a bottom surface; conductor patterns 25 formed on the bottom surface of the cavity 23a and extending to the outside of the casing 23 for receiving a power supply; a plurality of semiconductor light-emitting chips 22 having a top and bottom electrode mounted on the conductor patterns 25, each of the top and bottom electrodes of the semiconductor light-emitting chips 22 connected to the corresponding portion of the conductor patterns 25 via a bonding wire 27 or directly; and a wavelength converting layer 26 including a phosphor 26a disposed in the cavity 23a of the casing 23 so as to encapsulate the semiconductor light-emitting chips 22 in the cavity 23a.

A second conventional semiconductor light-emitting device including a dome-shaped wavelength-converting layer, for example, is disclosed in Patent Document No. 2 (Japanese Patent Application Laid Open JP2009-135136). FIG. 10 is a side cross-section view showing the second conventional semiconductor light-emitting device in which a dome-shaped wavelength converting layer is disposed on a top surface of a semiconductor light-emitting chip, and which is disclosed in Patent Document No. 2.

The second conventional semiconductor light-emitting device 30 includes: a mounting board 37; a semiconductor light-emitting chip 31 including a chip substrate 32 and a semiconductor epitaxial layer 33 grown on the chip substrate 32, and the semiconductor light-emitting chip 31 mounted on the mounting board 37; and a dome-shaped wavelength converting layer 36 including a phosphor 36a disposed on a top surface of the semiconductor light-emitting chip 31 so as to be able to wavelength-convert light emitted from the semiconductor epitaxial layer 31. In this case, the conventional device 30 can also include a plurality of semiconductor light-emitting chips 31 mounted along with the dome-shaped wavelength converting layer 36 on the mounting board 37.

A third conventional semiconductor light-emitting device including a wavelength-converting layer formed by a printing method, for example, is disclosed in Patent Document No. 3 (Japanese Patent Application Laid Open JP2010-118531). FIG. 11 is a perspective view showing the third conventional semiconductor light-emitting device disclosed in Patent Document No. 3. The third conventional semiconductor light-emitting device 40 includes: a mounting board 47; a plurality of semiconductor light-emitting chips 42 mounted on the mounting board 47; and a wavelength converting layer 46 formed on the mounting board 47 by a printing method so as to cover the plurality of semiconductor light-emitting chips 42.

Each of the above-described conventional semiconductor light-emitting devices can include a plurality of semiconductor light-emitting chips and can emit light having a substantially white color tone and a high light intensity via the wavelength converting layer. Accordingly, the conventional semiconductor light-emitting devices can be used as a light source for a vehicle headlight as well as other vehicle and non-vehicle applications in which high quality white light is desired. In addition, inventors of the presently disclosed subject matter disclose a semiconductor light-emitting device for a vehicle headlight in Patent Document No. 4 (U.S. patent application Ser. No. 13/162,151), which can emit light having a high light-emitting efficiency from a small light-emitting surface via a wavelength converting layer such as a ceramic phosphor plate.

When a semiconductor light-emitting device is used as a light source for a lighting unit such as a vehicle headlight, which controls light emitted from the light-emitting device using a reflector and/or a projector lens, a light-emitting device having a small light-emitting surface may be desired to efficiently control light emitted from the light-emitting device with a small optical structure. The semiconductor light-emitting device disclosed in Patent Document No. 4 can emit light having a high light-emitting efficiency from a small light-emitting surface, and therefore can be a match for the above-described usage.

In the conventional light-emitting devices including the respective wavelength converting layers, an amount of wavelength-converted light may vary in accordance with a respective amount of phosphors included in the wavelength converting layers. Therefore, a thickness of each of the wavelength converting layers is determined in accordance with each density of the phosphors included in the wavelength converting layers in order for the light-emitting devices to emit light having a desirable color tone, and each of the wavelength converting layers needs to be formed so as to become the determined thickness.

The above-referenced Patent Documents are listed below, and are hereby incorporated with their English abstracts in their entireties.
1. Patent Document No. 1: Japanese Patent Application Laid Open JP2006-48934
2. Patent Document No. 2: Japanese Patent Application Laid Open JP2009-135136
3. Patent Document No. 3: Japanese Patent Application Laid Open JP2010-118531
4. Patent Document No. 4: U.S. patent application Ser. No. 13/162,151

In recent years, it has be known that wavelength converting efficiency can be extremely improved by using a wavelength converting layer having a higher density (e.g. more than 50%) than a conventional density with respect to a phosphor contained in the wavelength converting layer, and therefore it has been verified that light-emitting efficiency of a semiconductor device using the wavelength converting layer including a high density of phosphor can improve. However, when light having a desirable color tone is emitted using the wavelength converting layer including a high density of phosphor, the wavelength converting layer can be formed in a thin and uniform thickness so as not to emit light having color variability.

When the wavelength converting layer is formed by the above-described methods, a variation of the thickness may occur in approximately 15 percent of product. The variation of the thickness may rarely cause a problem in which light having a color variability is emitted when the semiconductor light-emitting devices using a relatively thick wavelength converting layer including a low density of phosphor such as the conventional wavelength converting layer are employed as a light source for a general lighting field. However, when a very wide range area is illumined from a small light-emitting surface of a semiconductor device via an optical member such as a reflector, a projector lens and the like, for example as a light source for a vehicle headlight, and especially if the semiconductor device must emit light having a high light-emitting efficiency by using the wavelength converting layer including the phosphor having a high density, the variation of the thickness may become a more serious consideration in order to manufacture a high quality vehicle headlight.

The disclosed subject matter has been devised to consider the above and other problems, features, and characteristics. Thus, embodiments of the disclosed subject matter can include semiconductor light-emitting devices that can emit a wavelength-converted light having a high light-emitting efficiency from a small light-emitting surface by using a thin and uniform wavelength converting layer including a phosphor having a high density, and associated manufacturing methods that do not cause and/or are designed to prevent some of the above-described problems, concerns, and characteristics related to a wavelength converting layer. The disclosed subject matter can also include a semiconductor light-emitting device using a plurality of semiconductor light-emitting chips that can be used for wavelength-converting light having a high light-emitting efficiency via a thin and uniform wavelength converting layer including a high density of phosphor.

SUMMARY

The presently disclosed subject matter has been devised in view of the above and other problems, features, and characteristics. An aspect of the disclosed subject matter includes methods of manufacture that provide semiconductor light-emitting devices having a thin and uniform wavelength converting layer including a high density of phosphor and which can provide a similar lead time while using similar manufacturing machinery in comparison with conventional semiconductor light-emitting devices and processes.

According to an aspect of the disclosed subject matter, a semiconductor light-emitting device can include: a base board having a conductor pattern formed on a mounting surface thereof; a semiconductor light-emitting chip including chip electrodes adjacent a bottom surface thereof, each of the chip electrodes electrically connected to a respective portion of the conductor pattern of the base board via solder bumps; a transparent plate located over a top surface of the light-emitting chip so that a bottom surface thereof covers the top surface of the light-emitting chip; and a wavelength converting layer disposed between the bottom surface of the transparent plate and at least a side surface of the light-emitting chip so that a side surface thereof extends from the side surface of the light-emitting chip toward the bottom surface of the transparent plate, and including at least one phosphor having a particle size and a spacer having a particle size that is larger than the particle size of the at least one phosphor, wherein a thickness of the wavelength converting layer is between the top surface of the light-emitting chip and the bottom surface of the transparent plate and is configured by supporting the bottom surface of the transparent plate using the spacer having a particle size located on the top surface of the light-emitting chip.

In the above-described exemplary semiconductor light-emitting device, the semiconductor device can further include a frame located adjacent the mounting surface of the base board so as to surround the light-emitting chip and the wavelength converting layer, and a reflective material layer disposed at least between the frame and both side surfaces of the wavelength converting layer and the transparent plate and between the bottom surface of the light-emitting chip and the mounting surface of the base board, wherein a side slant surface of the reflective material layer contacts with the side surface of the wavelength converting layer and extends from the side surface of the light-emitting chip toward the bottom surface of the transparent plate.

In addition, the spacer can include at least one of an oxide silicon particle and a glass bead, and the particle size of the spacer can be 10 to 100 micro meters. The wavelength converting layer can contain the at least one phosphor of 50 weight percent or more. The light-emitting chip can be a blue light-emitting chip and the at least one phosphor can be selected from the group consisting of a yellow phosphor, and two phosphors including a red phosphor and a green phosphor. Furthermore, the light-emitting chip can be an ultraviolet light-emitting chip and the at least one phosphor can include at least one of a red phosphor, a green phosphor, and a blue phosphor.

According to the above-described exemplary semiconductor light-emitting device, the device can emit a wavelength-converted light from a top surface of the transparent plate that is slightly larger than the top surface of the light-emitting chip via the wavelength converting layer including a high density of phosphor, which can be formed in a thin and uniform shape between the transparent plate and the light-emitting chip by using the spacer having a particle size. Additionally, the side slant surface of the reflective material layer can be used as a reflector that extends from the side surface of the light-emitting chip toward the bottom surface of the transparent plate. Furthermore, the device can also include a plurality of semiconductor light-emitting chips with the above-described structures as set forth in the above paragraphs. Thus, the disclosed subject matter can provide semiconductor light-emitting devices that can emit a wavelength-converted light having a high light-emitting efficiency from a small light-emitting surface via the thin and uniform wavelength converting layer including a high density of phosphor.

Another aspect of the disclosed subject matter includes methods for manufacturing the above-described semiconductor light-emitting devices. An exemplary method can include: providing the base board; connecting each of the chip electrodes of the light-emitting chip to a respective portion of the conductor pattern of the base board via the solder bumps; disposing an uncured paste between the bottom surface of the transparent plate and the side surface of the light-emitting chip so as to extend from the side surface of the light-emitting chip toward the bottom surface of the transparent plate; and forming the wavelength converting layer having a thickness between the bottom surface of the transparent plate and the top surface of the light-emitting chip by solidifying the uncured paste.

In the above-described exemplary method for manufacturing semiconductor light-emitting devices, the same or similar variations of the device can also be employed as set forth in the above paragraphs.

According to the exemplary manufacturing method described above for the semiconductor light-emitting devices, the wavelength converting layer can be formed in a thin and uniform thickness by disposing an uncured paste between the bottom surface of the transparent plate and the side surface of the light-emitting chip and by supporting the bottom surface of the transparent plate using the spacer having a particle size, which is included in the wavelength converting layer located on the top surface of the light-emitting chip. Additionally, the wavelength converting layer can be formed in a reflector shape that extends from the side surface of the light-emitting chip toward the bottom surface of the transparent plate. The wavelength converting layer can be solidified while maintaining the thin and uniform thickness and the reflector shape. Thus, the method can provide semiconductor light-emitting devices having a small light-emitting surface and a high light-emitting efficiency including a thin and uniform wavelength converting layer using manufacturing machinery similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1A:
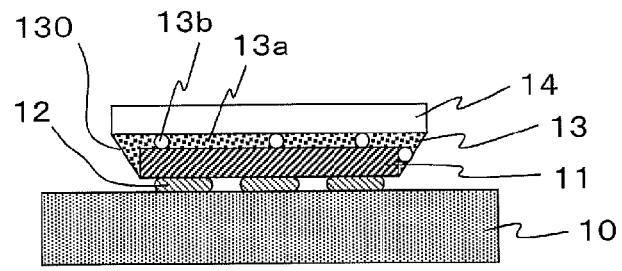
FIG. 1a is a side cross-section view showing a first exemplary embodiment of a semiconductor light-emitting device made in accordance with principles of the disclosed subject matter.
Figure 1B:
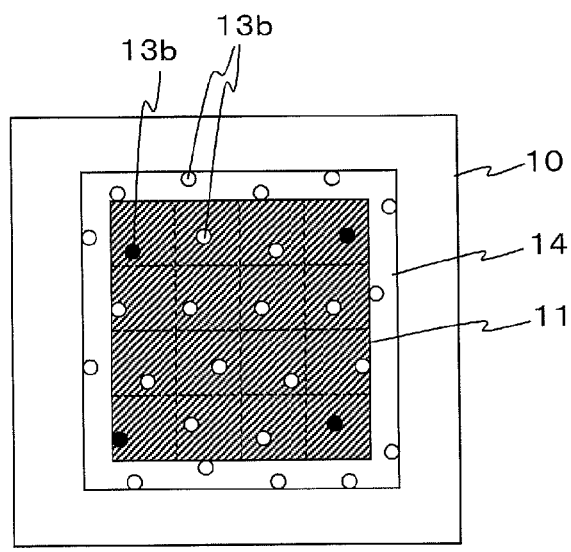
FIGS. 1b and 1c are top explanatory views showing locations of a particulate spacer in the first embodiment of the semiconductor light-emitting device.
Figure 1C:
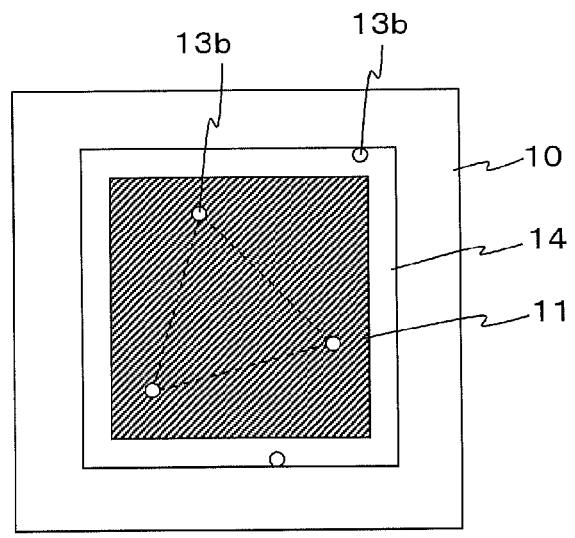

Exemplary embodiments and manufacturing methods of the disclosed subject matter will now be described in detail with reference to FIGS. 1 to 8. FIG. 1 is a side cross-section view showing a first exemplary embodiment of a semiconductor light-emitting device made in accordance with principles of the disclosed subject matter, and FIGS. 1b and 1c are top explanatory views showing locations of a particulate spacer in the first embodiment of the semiconductor light-emitting device.

The semiconductor light-emitting device can include: a base board 10 having a mounting surface and conductor patterns (not shown in FIG. 1) formed on the mounting surface; a flip chip type semiconductor light-emitting chip 11 having a top surface, a bottom surface, a side surface and chip electrodes adjacent the bottom surface mounted on the mounting surface of the base board 10 via solder bumps 12, and each of the chip electrodes electrically connected to respective conductor patterns of the base board 10 via the solder bumps 12; a wavelength converting layer 13 having a top surface and a side surface located so as to cover both the top surface and the side surface of the semiconductor light-emitting chip 11, and the top surface thereof being slightly larger than the top surface of the semiconductor light-emitting chip 11; and a transparent plate 14 having a top surface and a bottom surface located on the top surface of the wavelength converting layer 13.

In a base material of the wavelength converting layer 13, a phosphor 13a can be dispersed at a high density and a particulate spacer 13b can also be dispersed along with the phosphor 13a. A transparent material can be used as the base material of the wavelength converting layer 13, and an organic material such as a transparent resin, etc. and an inorganic material such as a glass and the like can be used as the base material. For example, a transparent resin such as a silicone resin, an epoxy resin and the like can be employed as the base material of the wavelength converting layer 13. Additionally, a filler and/or a pigment can also be dispersed in the base material if their sizes are smaller than a particle size of the spacer 13b.

The particulate spacer 13b that is contained in the wavelength converting layer 13 can be wedged between the top surface of the semiconductor light-emitting chip 11 and the bottom surface of the transparent plate 14. Accordingly, the particulate spacer 13b can determine a space between the top surface of the semiconductor light-emitting chip 11 and the bottom surface of the transparent plate 14, and thereby a thickness of the wavelength converting layer 13 can be configured.

The spacer 13b can be formed in a particulate shape having a desired particle size in accordance with a prescribed thickness of the wavelength converting layer 13 and can be formed in a polyhedron shape, a spherical shape, etc. For example, the spacer 13b can be formed in a particulate shape having a particle size of 10 to 100 micro meters. The particulate spacer 13b having such a particle size hardly diffuses light because the particle size thereof is 10 times more than a wavelength of a visible light emitted from the semiconductor light-emitting chip 11.

The particulate spacer 13b can be in direct contact with the bottom surface of the transparent plate 14 in an upper portion thereof, and also can be in direct contact with the top surface of the semiconductor light-emitting chip 11 in a bottom portion thereof. In addition, the base material of the wavelength converting layer 13 can be sandwiched between the particulate spacer 13b and the bottom surface of the transparent plate 14 and/or between the particulate spacer 13b and the top surface of the semiconductor light-emitting chip 11.

That is because an affinity may occur between the particulate spacer 13b and the base material of the wavelength converting layer 13 due to low viscosity of uncured base material and/or a wettability between the particulate spacer 13b and the base material of the wavelength converting layer 13, and thereby the base material may enter between the particulate spacer 13b and the bottom surface of the transparent plate 14 and/or between the particulate spacer 13b and the top surface of the semiconductor light-emitting chip 11. However, even in this case, the particulate spacer 13b can also prescribe the thickness of the wavelength converting layer 13 because the affinity can occur under the substantially same condition between all particles of the spacer 13b and the base material of the wavelength converting layer 13.

The particulate spacer 13b can be formed from an organic material such as a glass (e.g. Barium Titanium series glass) and the like, and also can be an inorganic material such as a resin and the like if the materials have a prescribed particle size with a high degree of accuracy. The particulate spacer 13b can be transparent or translucent for light emitted from the semiconductor light-emitting chip 11 and/or for an excited light emitted from the phosphor 13a. For example, a particle of oxide silicon such as silicon dioxide ($S_iO_2$), can be used as the particulate spacer 13b. In addition, a phosphor can also be dispersed in the particulate spacer 13b, and the same phosphor as the phosphor 13a can be used as the phosphor dispersed in the particulate spacer 13b.

The particulate spacer 13b can include one particle thereof located on each of four corners of the semiconductor light-emitting chip 11 as shown by black circles in FIG. 1b so that the particulate spacer 13b can support the bottom surface of the transparent plate 14 in parallel with the top surface of the semiconductor light-emitting chip 11. The particulate spacer 13b can also support the bottom surface of the transparent plate 14 via the top surface of the semiconductor light-emitting chip 11 using at least three particles thereof as shown in FIG. 1c.

Each particle of the particulate spacer 13b may not have an function such that varies a related location with respect to each other by an attraction and a repulsion between the particles of the spacer 13b because the particle size of the spacer 13b is large. Accordingly, each particle of the spacer 13b can be located on the top surface of the semiconductor light-emitting chip 11 while maintaining each particle in a dispersing state of a mixture with the phosphor 13a and the base material of the wavelength converting layer 13.

Therefore, in order to locate the one particle of the spacer 13b on each of the four corners of the top surface of the semiconductor light-emitting chip 11 like the black circles shown in FIG. 1b, the particulate spacer 13b can be mixed with the base material of the wavelength converting layer 13 including the phosphor 13a so that a density of the particle spacer 13b can become such a degree that each particle of the spacer 13b can be dispersed on each of the vertical squares of the top surface of the semiconductor light-emitting chip 11 as shown in FIG. 1b, and then can be located on the top surface of the semiconductor light-emitting chip 11.

In this case, each particle of the spacer 13b can stochastically be located on each of the vertical squares of the top surface of the semiconductor light-emitting chip 11 by disposing the particulate spacer 13b on the top surface of the semiconductor light-emitting chip 11 by an applying method, a printing method, etc. Accordingly, one particle of the spacer 13b can be located on each of the four corners of the top surface of the semiconductor light-emitting chip 11 at a high rate.

A phosphor 13a, in which a particle size is smaller than that of the particulate spacer 13b, can be used as a wavelength converting material for the wavelength converting layer 13. In this case, if the particle size of the phosphor 13a is only slightly smaller than that of the particulate spacer 13b, the phosphor 13a can be used for the wavelength converting layer 13, and also the phosphor 13a having a particle size that is less than 10 percent of the particle size of the spacer 13b can be used for the wavelength converting layer 13.

The semiconductor light-emitting chip 11 can be a blue LED chip having a peak wavelength of 460 nanometers. The phosphor 13a contained in the wavelength converting layer 13 can convert light emitted from the semiconductor light-emitting chip 11 into a particular wavelength or range of wavelengths of light. Thus, the phosphor 13a can be excited by the light emitted from the semiconductor light-emitting chip 11, and can emit a wavelength-converted light. Accordingly, the semiconductor light-emitting device can emit a different wavelength from that of the semiconductor light-emitting chip 11 by an additive color mixture of a part of the light emitted from the semiconductor light-emitting chip 11 and the wavelength-converted light excited by another part of the light.

When the semiconductor light-emitting chip 11 is a blue LED chip having a peak wavelength of 460 nanometers and the phosphor 13 is a yellow phosphor such as YAG, the yellow phosphor can emit a yellow light upon being excited by blue light emitted from the blue LED chip. Therefore, the semiconductor light-emitting device can emit substantially white light by an additive color mixture of the excited yellow light emitted from the yellow phosphor and a part of the blue light emitted from the blue LED chip.

The yellow phosphor can include, $Y_3Al_5O_{12}: Ce^{3+}$ (YAG), $(Sr, Ba)_2SiO_4: Eu^{2+}, Ca_x(Si,Al)_{12}(O,N)_{16}: Eu^{2+}$ and the like. In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light.

The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6 (O, N)$: $Eu^{2+}$ and the like can be used as the green phosphor. The semiconductor light-emitting chip 11 can include an LED of InGaN series that emits near-ultraviolet light having a wavelength of approximately 380 nanometers, a laser diode that emits ultraviolet light, and the like.

In this case, in order to emit substantially white light, the phosphor 13a can include: a red phosphor wavelength-converting the ultraviolet light into red light; a green phosphor wavelength-converting the ultraviolet light into green light; and a blue phosphor wavelength-converting the ultraviolet light into blue light. $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like can be used as the red phosphor. $(Si, Al)_6 (O, N)$: $Eu^{2+}$, $BaMgAl_{10}O_{17}$: $Eu^{2+}$ $Mn^{2+}$, $(Ba, Sr)_2SiO_4$: $Eu^{2+}$ and the like can be used as the green phosphor. $(Sr, Ca, Ba, Mg)_{10}(PO_4)_6C_{12}$: $Eu^{2+}$, $BaMgAl_{10}O_{17}$: $Eu^{2+}$, $LaAl (Si, Al)_6 (N, O)_{10}$: $Ce^{3+}$ and the like can be used as the blue phosphor.

The transparent plate 14 can include a bottom surface that is substantially flat and a substantially uniform space can be maintained between the top surface of the semiconductor light-emitting chip 11 and the bottom surface of the transparent plate 14 to define the wavelength converting layer 13. The uniform space can be maintained by supporting the bottom surface of the transparent plate 14 with the particulate spacer 13b having a particle size, which is contained in the wavelength converting layer 13.

The bottom surface of the transparent plate 14 can be formed in a substantially planar shape as a whole, and a fine concavo-convex shape can also be formed on the bottom surface of the transparent plate 14 to diffuse the above-described additive color mixed light and to emit a well-mixed even light, microscopically. In this case, the fine concavo-convex shape can be formed in a size of 5 micro meters or less so as not to affect functions of the phosphor 13a and the particulate spacer 13b adversely. Additionally, the fine concavo-convex shape can also be formed on the top surface of the transparent plate 14 to efficiently emit the well-mixed even light.

Moreover, because the top surface of the transparent plate 14 is a light-emitting surface of the semiconductor light-emitting device, a surface treatment can be implemented on the top surface of the transparent plate 14 to improve a light-emitting efficiency of the semiconductor device. Therefore, the top surface of the transparent plate 14 need not necessarily be formed in a planar shape, and the top surface can also be formed in a shape intended to diffuse light emitted from the semiconductor device or gather the light, such as a concavo-convex shape, a convex lens shape, a concave lens shape, etc.

The transparent plate 14 can be made of a transparent material to transmit light emitted from the semiconductor light-emitting chip 11 and a wavelength-converted light by the phosphor 13a, and also can be made of a material having a desired optical characteristic. For example, a filter formed into a sheet that shields light of a certain wavelength can be used as the transparent plate 14. In addition, a phosphor glass plate including a phosphor that converts light emitted from the semiconductor light-emitting chip 11 into light having a predetermined wavelength can be employed as the transparent plate 14. A phosphor ceramic plate (e.g. YAG plate) that is made by sintering a phosphor material can also be employed as the transparent plate 14. In this case, because a density of the phosphor 13a contained in the wavelength converting layer 13 can be reduced, it may become easy to control a thickness of the wavelength converting layer 13. Furthermore, two or three phosphor layers can also be formed by the transparent plate and the wavelength converting layer 13 in order to emit various colored lights.

The base board 10 can include an Aluminum nitride substrate having a high thermal conductivity and the like, and the conductor patterns can be made from Au (gold) and the like and formed on the base board 10 in order to mount the semiconductor light-emitting chip 11 via the solder bumps 12 and to receive a power supply for the semiconductor light-emitting chip 11. Au bump (gold bump) and the like can be used as the solder bumps 12.

In the above-described semiconductor light-emitting device of the first embodiment, the wavelength converting layer 13 can be formed in a prescribed thin thickness with a high degree of accuracy by disposing the particulate spacer 13b in the wavelength converting layer 13. Therefore, a density of the phosphor 13a mixed with the base material of the wavelength converting layer 13 can be set up at a high density so as to improve wavelength converting efficiency.

For example, the density of the phosphor 13a can be maintained at 13 to 90 percent and the thickness of the wavelength converting layer 13 can be maintained at 30 to 200 micro meters while a variation of the thickness is maintained at 10 percent or less. In this case, a density of the phosphor 13a can be 30 weight percent or more, and a density of the phosphor 13a can also be 50 weight percent or more.

Figure 2A:
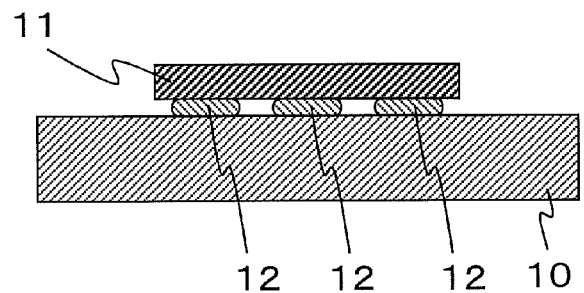
FIGS. 2a to 2c are cross-section schematic explanatory views showing an exemplary manufacturing process for a semiconductor light-emitting device made in accordance with principles of the disclosed subject matter.
Figure 2B:
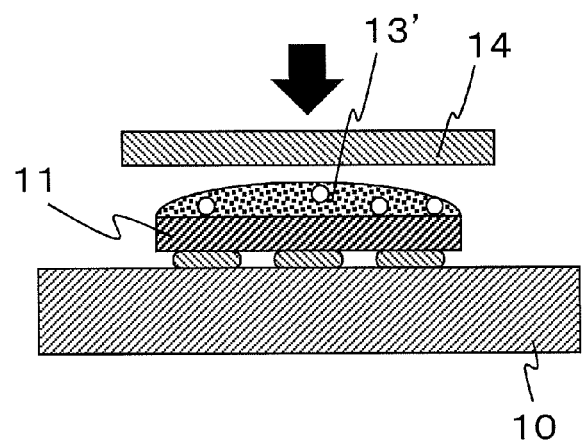
Figure 2C:
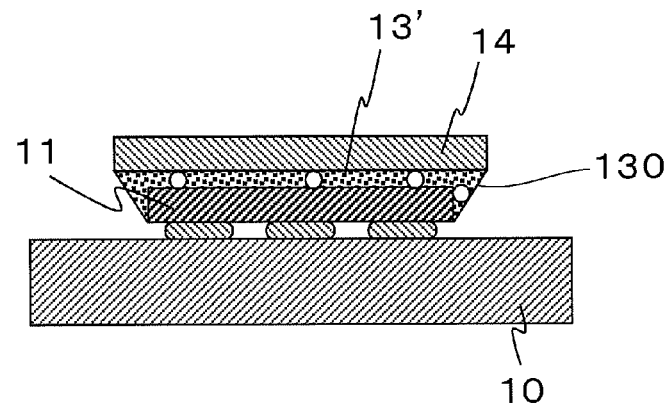

A manufacturing method for the above-described semiconductor light-emitting device will now be described with reference to FIGS. 2a to 2c. FIGS. 2a to 2c are cross-section schematic explanatory views showing an exemplary manufacturing process for the semiconductor light-emitting device made in accordance with principles of the disclosed subject matter.

Process (a) is preparing the base board 10 having the conductor patterns formed on the mounting surface and the semiconductor light-emitting chip 11, and mounting the semiconductor light-emitting chip 11 on the conductor patterns of the base board 10 via the solder bumps 12, as shown in FIG. 2a.

Process (b) is preparing an uncured paste 13', in which the phosphor 13a and the particulate spacer 13b are dispersed in an uncured base material of the wavelength converting layer 13 by mixing the phosphor 13a and the particulate spacer 13b with the uncured base material at a prescribed density, and applying the uncured paste 13' on the top surface of the semiconductor light-emitting chip 11, and then mounting the transparent plate 14 that is formed in a slightly larger size than the top surface of the semiconductor light-emitting chip 11 on the uncured paste 13', as shown in FIG. 2b.

Process (c) is forming a reflector shape of the uncured paste 13' having a thickness between the bottom surface of the transparent plate 14 and the top surface of the semiconductor light-emitting chip 11, which is configured by the spacer 13b having a particle size by supporting the bottom surface of the transparent plate 14 with the particulate spacer 13b contained in the uncured paste 13' located on the top surface of the semiconductor light-emitting chip 11, and solidifying the uncured paste 13' under a predetermined curing condition, as shown in FIG. 2c. Thereby, the semiconductor light-emitting device shown in FIG. 1a can be finished.

In this case, the reflector shape of the uncured paste 13' having the prescribed thickness can be formed by a weight of the transparent plate 14, and alternatively can be formed by applying a load on the top surface of the transparent plate 14 if necessary. In addition, the reflector shape of the uncured paste 13' can extend from the side surface of the semiconductor light-emitting chip 11 to the bottom surface of the transparent plate 14 by maintaining a surface tension while the uncured paste 13' covers at least a part of the side surface of the semiconductor light-emitting chip 11.

In the semiconductor light-emitting device manufactured by the above-described method, light emitted in an upward direction from the semiconductor light-emitting chip 11 can enter the wavelength converting layer 13 and a part of the light can be converted into light having a prescribed wavelength by the phosphor 13a of the wavelength converting layer 13. Accordingly, the semiconductor light-emitting device can emit a different wavelength from that of the semiconductor light-emitting chip 11 by an additive color mixture of the wavelength-converted light excited by the part of the light emitted from the semiconductor light-emitting chip 11 and another part of the light.

In this case, light emitted from the side surface of the semiconductor light-emitting chip 11 can also enter the wavelength converting layer 13 and a part of the light can be converted into light having a prescribed wavelength by the phosphor 13a of the wavelength converting layer 13. The wavelength-converted light excited by the part of the light emitted from the side surface of the semiconductor light-emitting chip 11 and another part of the light may mostly be reflected toward the transparent plate 14 until they get to a side slant surface 130 or on the side slant surface 130 because of the phosphor 13a having a high density, and can be emitted as mixture light from the transparent plate 14.

When the light emitted from the side surface of the semiconductor light-emitting chip 11 passes into the side slant surface 130 due to a low density of phosphor and a shape of the side surface, at least the side slant surface can be coated with a reflective material layer, and also the side surface of the transparent plate and a part of the side surface of the semiconductor light-emitting chip 11 exposed from the wavelength converting layer 13 can be coated with the reflective material layer described in detail later.

The density of the phosphor 13a contained in the wavelength converting layer 13 can be set up at a high density because the wavelength converting layer 13 can be formed in a thin thickness as described above. Accordingly, a wavelength converting efficiency of the wavelength converting layer 13 can improve. In addition, because the thickness of the wavelength converting layer 13 can be configured with a high accuracy by the particle size of the spacer 13b in accordance with the density of the phosphor 13a, the wavelength converting layer can be formed in a substantially uniform thickness and a variation of thickness between products can be maintained at a small value. Therefore, the disclosed subject matter can provide semiconductor light-emitting devices that can emit a substantially uniform light having a high light-emitting efficiency, in which a variation of light-emitting color between the devices is small In the above-described embodiment, a case where the side slant surface 130 of the wavelength converting layer 13 can be formed in a linear shape connecting an end of the bottom surface of the transparent plate 14 to an end of the bottom surface of the semiconductor light-emitting chip 11 as shown in FIG. 1a is described. However, the side slant surface 130 is not limited to the linear shape. For example, the side slant surface 130 can also be formed in a concave shape extending in an inward direction towards a center of the device and in a convex shape extending in an outward direction away from a center of the semiconductor light-emitting device as shown in FIGS. 3a and 3b, respectively.

Figure 3A:
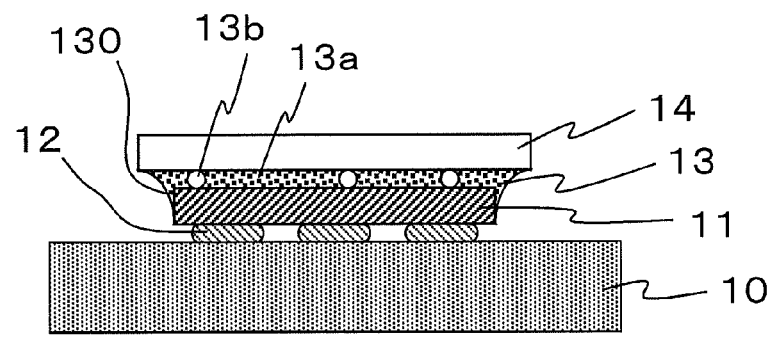
FIGS. 3a to 3c are side cross-section views depicting variations of a wavelength converting layer in the semiconductor light-emitting device of FIG. 1.
Figure 3B:
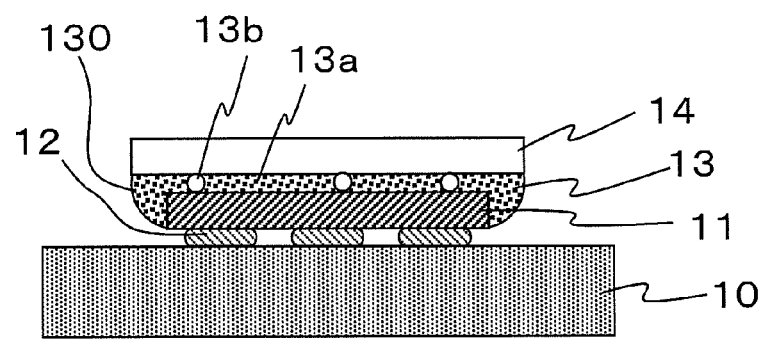
Figure 3C:
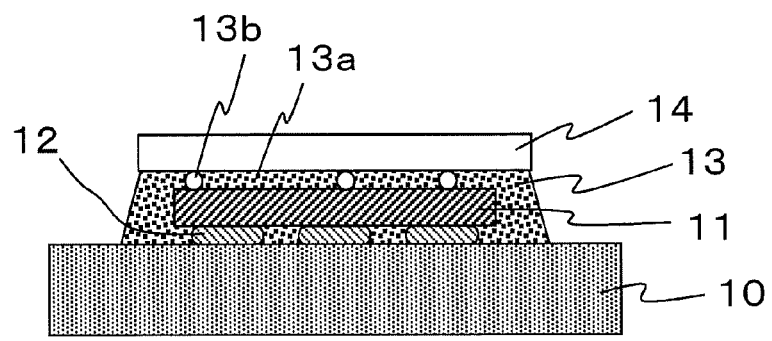

In addition, the side surface of the wavelength converting layer 13 can be formed in a linear shape connecting the end of the bottom surface of the transparent plate 14 to the mounting surface of the base board 10 so that the wavelength converting layer 13 covers the semiconductor light-emitting chip 11 and the solder bumps 12 as shown in FIG. 3c. The shape of the side surface of the wavelength converting layer 13 can be controlled by changing an amount of the uncured paste 13', which applies on the top surface of the semiconductor light-emitting chip 1 in process (b) shown in FIG. 2b.

When the amount of the uncured paste 13' is small, the side slant surface 130 can be formed in a concave shape extending in an inward direction towards a center of the device as shown in FIG. 3a. When the amount of the uncured paste 13' of FIG. 3a increases, the side slant surface 130 can be formed in a linear shape connecting the end of the bottom surface of the transparent plate 14 to the end of the bottom surface of the semiconductor light-emitting chip 11 as shown in FIG. 1a. When the amount of the uncured paste 13' of FIG. 1a further increases, the side slant surface 130 can be formed in a concave shape extending in an outward direction away from a center of the semiconductor light-emitting device as shown in FIG. 3b. Moreover, when the amount of the uncured paste 13' of FIG. 3b increases, the side surface of the wavelength converting layer 13 can be formed in a linear shape connecting the end of the bottom surface of the transparent plate 14 to the mounting surface of the base board 10 as shown in FIG. 3c.

Figure 4A:
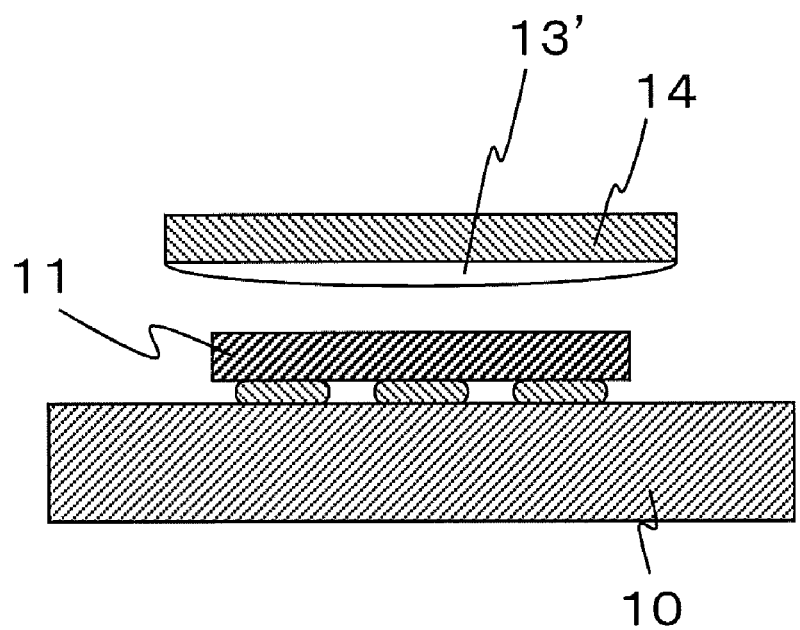
FIGS. 4a and 4b are cross-section views showing variations of an applying location of a paste in the process of FIG. 2b.
Figure 4B:
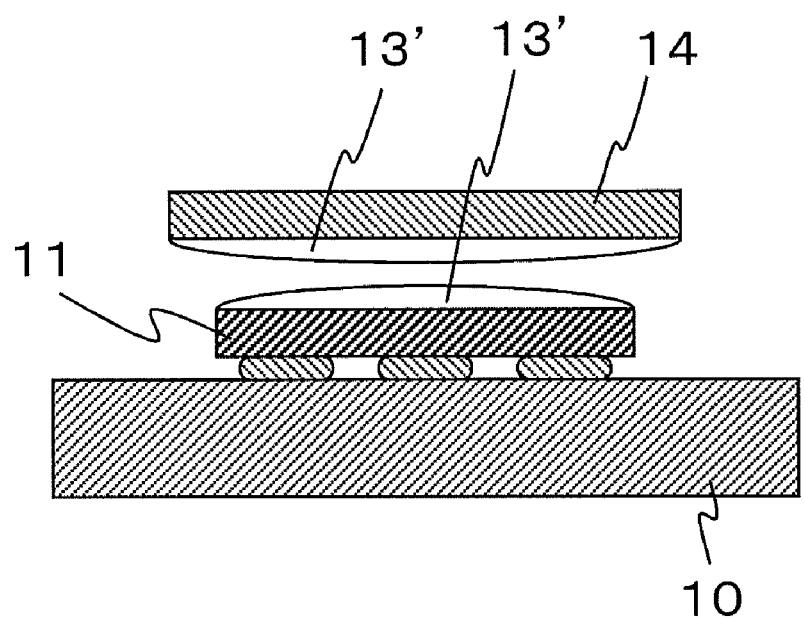

In the above-described manufacturing method, the uncured paste 13' can be applied on the top surface of the semiconductor light-emitting chip 11 in process (b) of FIG. 2b. However, the disclosed subject matter is not limited to this method. For example, the uncured paste 13' can be applied underneath the bottom surface of the transparent plate 14 as shown in FIG. 4a, and also the uncured paste 13' can be applied both on the top surface of the semiconductor light-emitting chip 11 and underneath the bottom surface of the transparent plate 14 as shown in FIG. 4b.

Figure 5A:
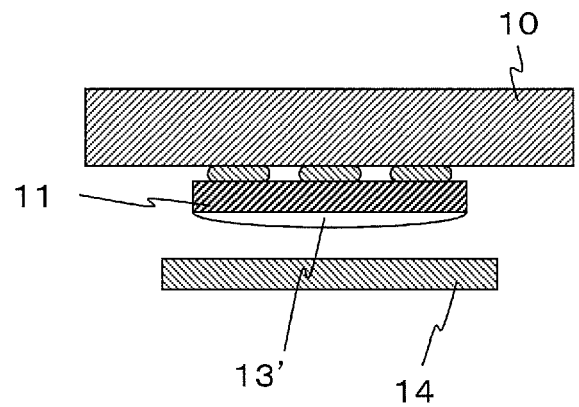
FIGS. 5a to 5c are cross-section views showing variations of the applying location of the paste when a semiconductor light-emitting chip is located in a downward direction in the process of FIG. 2b.
Figure 5B:
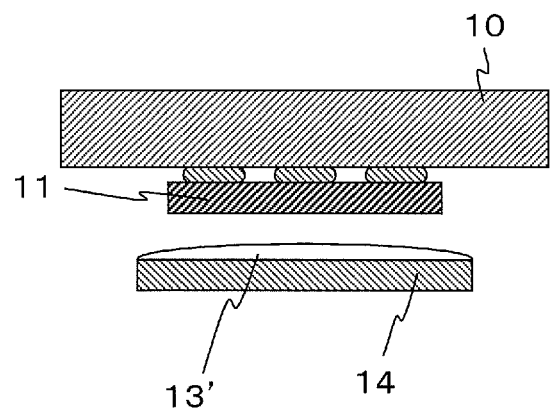

In addition, the uncured paste 13' can be disposed between the top surface of the semiconductor light-emitting chip 11 and the bottom surface of the transparent plate 14 and around the side surface of the semiconductor light-emitting chip 11 by applying the uncured paste 13' underneath the top surface of the semiconductor light-emitting chip 11 while the semiconductor light-emitting chip 11 mounted on the base board 10 is directed downward, as shown in FIG. 5a. In this case, the uncured paste 13' can be disposed between the top surface of the semiconductor light-emitting chip 11 and the bottom surface of the transparent plate 14 and around the side surface of the semiconductor light-emitting chip 11 by applying the uncured paste 13' on the bottom surface of the transparent plate 14 as shown in FIG. 5b.

Figure 5C:
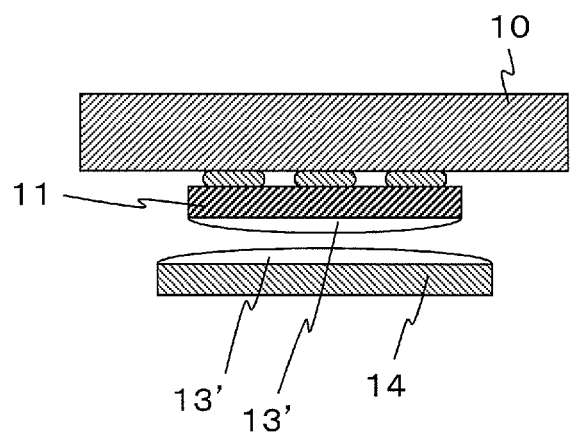
Figure 6:
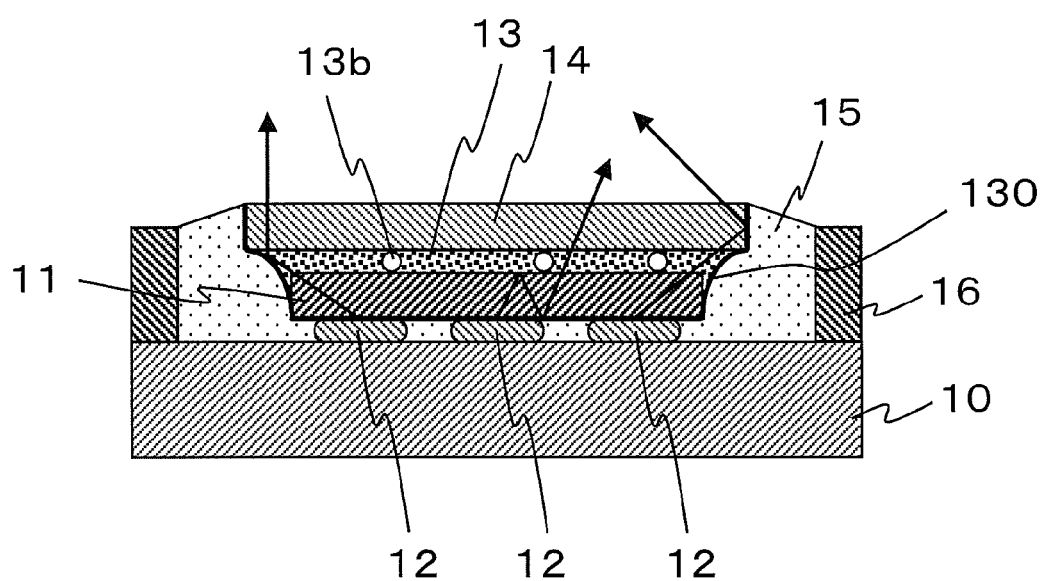
FIG. 6 is a side cross-section view showing a second exemplary embodiment of a semiconductor light-emitting device made in accordance with principles of the disclosed subject matter.

Moreover, the uncured paste 13' can also be disposed between the top surface of the semiconductor light-emitting chip 11 and the bottom surface of the transparent plate 14 and around the side surface of the semiconductor light-emitting chip 11 by applying the uncured paste 13' both underneath the top surface of the semiconductor light-emitting chip 11 and on the bottom surface of the transparent plate 14, as shown in FIG. 5c A second exemplary embodiment will now be described with reference to FIG. 6. FIG. 6 is a side cross-section view showing a second exemplary embodiment of a semiconductor light-emitting device made in accordance with principles of the disclosed subject matter. The second embodiment of the semiconductor light-emitting device can include a reflective material layer 15, which covers both side surfaces of the wavelength converting layer 13 and the transparent layer 14 and a space between the bottom surface of the light-emitting chip 11 and the mounting surface of the base board 10 in the semiconductor light-emitting device shown in FIG. 3a, in order to further improve the light-emitting efficiency of the device.

More specifically, the semiconductor light-emitting device can include; the semiconductor light-emitting device shown in FIG. 3a; a frame 16 located along an outer circumference of the base board 10 so as to surround the semiconductor light-emitting chip 11 and the wavelength converting layer 13; and the reflective material layer 15 made of a material having a high reflectivity, disposed between the frame 16 and side surfaces of the wavelength converting layer 13 and the transparent plate 14 and between the bottom surface of the semiconductor light-emitting chip 11 and the mounting surface of the base board 10 so as to fill spaces between the solder bumps 12.

The frame 16 can be formed from the same material as the base board 10, such as with aluminum nitride having a high thermal conductivity, ceramics, and the like. The frame 16 can be attached on the outer circumference of the mounting surface of the base board 10 via an adhesive material so as to surround the semiconductor light-emitting chip 11 and the wavelength converting layer 13, which is located between the semiconductor light-emitting chip 11 and the transparent plate 14.

The reflective material layer 15 can be made by dispersing a reflective filler such as titanium oxide, zinc oxide and the like into a transparent resin such as a silicone resin and can be disposed between the frame 16 and both side surfaces of the wavelength converting layer 13 and the transparent plate 15 so as to fill a apace between the bottom surface of the semiconductor light-emitting chip 11 and the mounting surface of the base board 10. A top surface of the reflective material layer 15 can be formed between an end of the top surface of the transparent plate 14 and an inner end of a top surface of the frame 16. Consequently, the semiconductor light-emitting device can be constructed so that the top surface of the transparent plate 14 can become the light-emitting surface, which is slightly larger than the top surface of the semiconductor light-emitting chip 11.

In the semiconductor light-emitting device having such as structure, light emitted in an upward direction of the semiconductor light-emitting chip 11 from the light-emitting chip 11 can enter into the wavelength converting layer 13, and a wavelength converted light can be emitted from the top surface of the transparent plate 14 as the mixture light having a different wavelength from that of the semiconductor light-emitting chip 11.

Light emitted in a downward direction of the semiconductor light-emitting chip 11 from the light-emitting chip 11 can be reflected in an upward direction at the bottom surface of the light-emitting chip 11 by the reflective material layer 15, which is disposing between the bottom surface of the semiconductor light-emitting chip 11 and the mounting surface of the base board 10 so as to fill the spaces between the solder bumps 12, and can be emitted from the top surface of the semiconductor light-emitting chip 11 toward the wavelength converting layer 13. Then, a wavelength converted light can be emitted from the top surface of the transparent plate 14 as well as the light emitted in the upward direction from the semiconductor light-emitting chip 11.

Therefore, because the light emitted in the downward direction of the semiconductor light-emitting chip 11 can be emitted from the top surface of the transparent plate 14 while the structure prevents a decay of the light in the downward direction, which is caused by repeating a reflection between the bottom surface of the semiconductor light-emitting chip 11 and the mounting surface of the base board 10, the light use efficiency of the semiconductor light-emitting device can improve.

Light emitted in a crosswise direction of the semiconductor light-emitting chip 11 from the light-emitting chip 11 can enter into the wavelength converting layer 13 from the side surface of the light-emitting chip 11, and can be reflected toward the transparent plate 14 by the side slant surface 130, which is a boundary surface between the wavelength converting layer 13 and the reflective material layer 15. Accordingly, because the light emitted in the crosswise direction of the light-emitting chip 11 is prevented from leaking from the side slant surface of the wavelength converting layer 13 and/or cannot be absorbed in the semiconductor light-emitting chip 11, the light-emitting efficiency of the device can improve.

The bottom surface of the transparent layer 14 can be slightly larger than the top surface of the semiconductor light-emitting chip 11, and the wavelength material layer 13 can be located between the top surface of the semiconductor light-emitting chip 11 and the bottom surface of the transparent layer 14 so that the wavelength material layer 14 can cover the semiconductor light-emitting chip 11 in the reflector shape thereof. In other words, an outermost periphery of the semiconductor light-emitting chip 11 will be completely blocked from view by the transparent plate 14 when the device is viewed from a position on the main optical axis which extends normal to the top center surface of the chip 11. Therefore, the side slant surface 130 formed on the boundary between the reflective material layer 15 and the wavelength converting layer 13 can become a reflective surface, which can reflect light emitted in a crosswise direction from the light-emitting chip 11 toward the bottom surface of the transparent plate 14.

That is to say, the reflective material layer 15 can perform as a reflector for the semiconductor light-emitting chip 11 by using the side slant surface 130 and the boundary surface contacting with the bottom surface of the semiconductor light-emitting chip 11. Thus, the semiconductor light-emitting device can improve light-emitting efficiency as compared with the first embodiment of the semiconductor light-emitting device.

In addition, because the reflective material layer 15 contacts with the side surface of the transparent plate 14, the top surface of the transparent plate 14 can perform as a light-emitting surface of the semiconductor light-emitting device. Thus, the disclosed subject matter can realize a very small light-emitting surface that is slightly larger than the top surface of the semiconductor light-emitting chip 11, by using the top surface of the transparent plate 14.

The above-described reflecting material layer 15 can include the side slant surface 130, which is formed in the convex shape in the inward direction of the semiconductor light-emitting device as shown in FIG. 6 or in the linear shape as shown in FIG. 1a, in order to increase light directed toward the bottom surface of the transparent plate 14. When the side slant surface 130 is formed in the convex shape in the inward direction of the light-emitting device, a curvature of the convex shape can be formed at 5 or less as described in Patent Document No. 4, in which inventors of the presently subject matter disclose a result of a computer simulation.

An end of the side slant surface 130 toward the semiconductor light-emitting chip 11 does not always need be located at the end of the bottom surface of the semiconductor light-emitting chip 11. The end of the side slant surface 130 can be located on the side surface of the semiconductor light-emitting chip 11, which is between both ends of the top and bottom surface of the semiconductor light-emitting chip 11. When the end of the side slant surface 130 is located on the side surface of the semiconductor light-emitting chip 11, the side slant surface 130 can become the reflex (e.g., a reflector type) surface, which can reflect light emitted in the crosswise direction of the semiconductor light-emitting chip 11 toward the bottom surface of the transparent plate 14.

The semiconductor light-emitting chip 11 can be mounted on the conductor patterns of the mounting surface of the base board 10 using a flip-chip structure. For example, electrodes that are coplanar with the bottom surface of the chip 11 can be connected to conductor patterns of the mounting surface of the base board 10. When the semiconductor light-emitting chip 11 is a flip-chip type chip, because a light-emitting layer of the semiconductor light-emitting chip 11 may be located close to the bottom surface of the semiconductor light-emitting chip 11, a reflex feature of the side slant surface 130 can be performed with high efficiency.

As described above, the disclosed subject matter can provide a small semiconductor light-emitting device having a small light-emitting surface, which is the top surface of the transparent layer 14. In this case, because the reflective material layer 15 can be formed in a reflector shape that extends from the semiconductor light-emitting chip 11 in a light-emitting direction of the light-emitting device, the light emitted in the crosswise direction of the light-emitting chip 11 can be prevented from returning to the light-emitting chip 11 and can be reflected toward the transparent plate 14 by the side slant surface 130. Thus, the disclosed subject matter can provide a small semiconductor light-emitting device having a high light-emitting efficiency.

A manufacturing method for the second embodiment of the semiconductor light-emitting device will now be described with reference to FIGS. 7*a* to 7*e*. FIGS. 7*a* to 7*e* are cross-section schematic explanatory views showing an exemplary manufacturing process for the second embodiment of the semiconductor light-emitting device, in which the side slant surface 130 can be formed in a linear shape connecting the end of the bottom surface of the transparent plate 14 to the end of the bottom surface of the semiconductor light-emitting chip 11 as shown in FIG. 1*a*. In this case, processes (a) to (c) shown in FIGS. 7*a* to 7*c* can be the same as or similar to processes (a) to (c) of the first embodiment as shown FIGS. 2*a* to 2*c*.

Figure 7A:
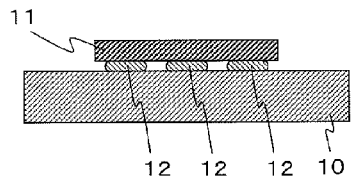
FIGS. 7a to 7e are cross-section schematic explanatory views showing an exemplary manufacturing process for the second embodiment of the semiconductor light-emitting device.

Process (a) is preparing the base board 10 having the conductor patterns formed on the mounting surface and the semiconductor light-emitting chip 11, and mounting the semiconductor light-emitting chip 11 on the conductor patterns of the base board 10 via the solder bumps 12, as shown in FIG. 7*a*.

Figure 7B:
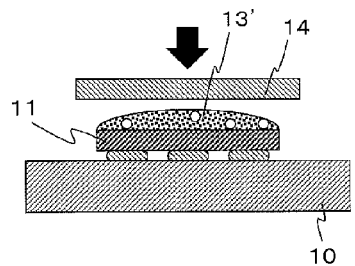

Process (b) is preparing an uncured paste 13', and applying the uncured paste 13' on the top surface of the semiconductor light-emitting chip 11, and then mounting the transparent plate 14 on the uncured paste 13', as shown in FIG. 7*b*.

Figure 7C:
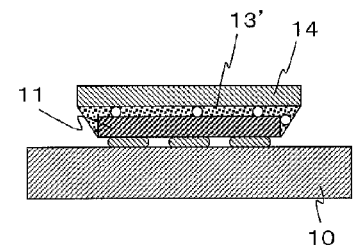
Figure 7D:
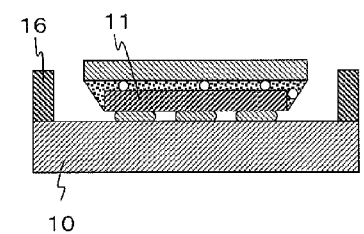
Figure 7E:
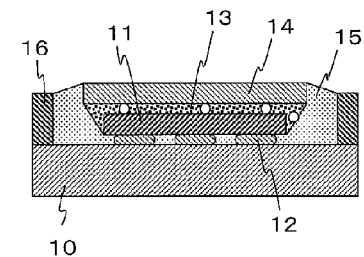

Process (c) is forming a reflector shape of the uncured paste 13' having a thickness between the bottom surface of the transparent plate 14 and the top surface of the semiconductor light-emitting chip 11, and solidifying the uncured paste 13' under a predetermined curing condition, as shown in FIG. 7*c*.

In this case, the uncured paste 13' may be semi-solidified under a semi-curing condition if the reflector shape does not vary in following processes.

Process (d) is attaching the frame 16 on the outer circumference of the mounting surface of the base board 10 via the adhesive material so as to surround the semiconductor light-emitting chip 11 and the wavelength converting layer 13, which is located between the semiconductor light-emitting chip 11 and the transparent plate 14.

Process (e) is disposing an uncured reflective material between the frame 16 and both side surfaces of the transparent plate 14 and the wavelength converting layer 13 and in the space between the bottom surface of the semiconductor light-emitting chip 11 and the mounting surface of the base board 10 so that the uncured reflective material can contact with both side surfaces of the transparent plate 14 and wavelength converting layer 13 without a space, by a dispenser and the like, thus forming the wavelength converting layer 13 including the above-described side slant surface 130 by solidifying the uncured reflective material under a prescribed curing condition, and finishing the semiconductor light-emitting device. The above process steps can be done consecutively and sequentially, or can be interchanged in timing and non-sequential.

By creating the side slant surface 130 of the wavelength converting layer 13 using the surface tension of the uncured transparent material, and by disposing the uncured reflective material between the frame 16 and the both side surfaces of the transparent plate 14 and the wavelength converting layer 13, the side slant surface 130 of the wavelength converting layer 13 can be formed in a prescribed shape and the reflective material layer 15 can be attached to the side surface of the transparent plate 14.

Thereby, the reflector shape having a predetermined shape can be formed from the side surface of the semiconductor light-emitting chip 11 to the bottom surface of the transparent pale 14 without a machining process. In addition, the manufacturing method can also dispose the reflective material in the space between the bottom surface of the semiconductor light-emitting chip 11 and the mounting surface of the base board 10 when disposing the reflective material between the frame 16 and both side surfaces of the transparent plate 14 and the wavelength converting layer 13.

Accordingly, the manufacturing method can prevent the semiconductor light-emitting chip 11 from emitting light leaked from the side slant surface 130 of the wavelength converting layer 13 and can also prevent a decay of light emitted in the downward direction of the light-emitting chip 11. Thus, the manufacturing method can provide semiconductor light-emitting devices having a high light-emitting efficiency. Moreover, because the light-emitting surface of the device is small, light emitted from the semiconductor light-emitting device can be efficiently controlled by a small and simple optical member. Furthermore, the manufacturing method can vary the shape of the side slant surface 130 of the wavelength converting layer 13 by adjusting the amount of the uncured transparent material 13', which is applied on the top surface of the semiconductor light-emitting chip 11.

Figure 8A:
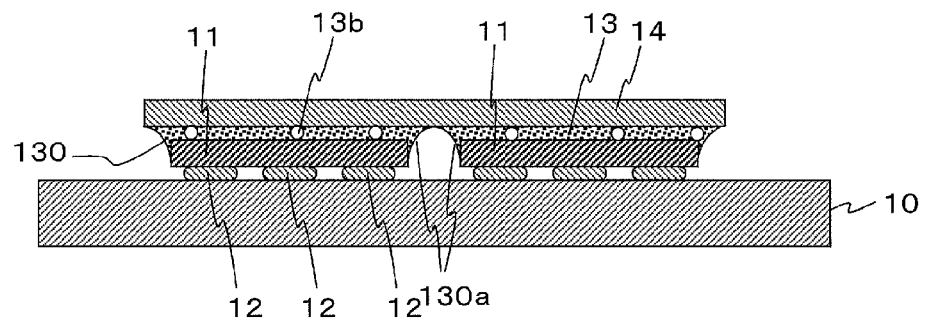
FIGS. 8a to 8c are side cross-section views showing third exemplary embodiments including a plurality of light-emitting chips of a semiconductor light-emitting device made in accordance with principles of the disclosed subject matter.
Figure 8B:
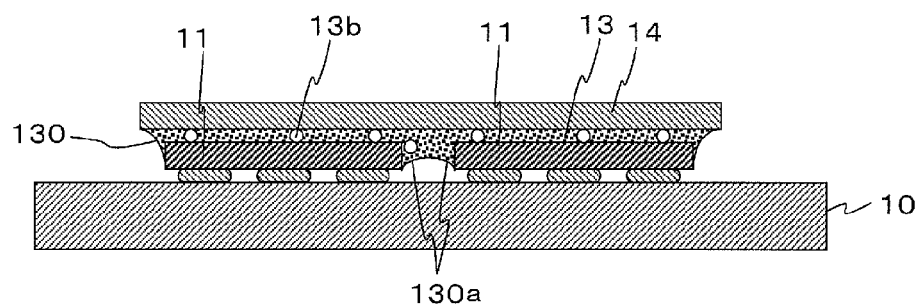
Figure 8C:
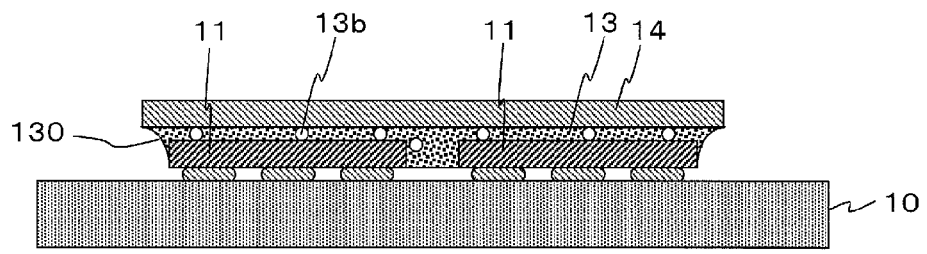
Figure 9:
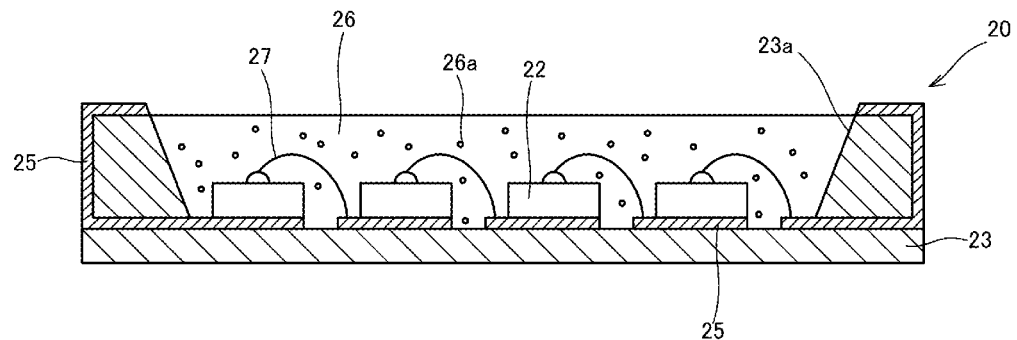
FIG. 9 is a side cross-section view showing a first conventional semiconductor light-emitting device including a wavelength-converting layer disposed in a cavity in which a plurality of semiconductor light-emitting chips are mounted.
Figure 10:
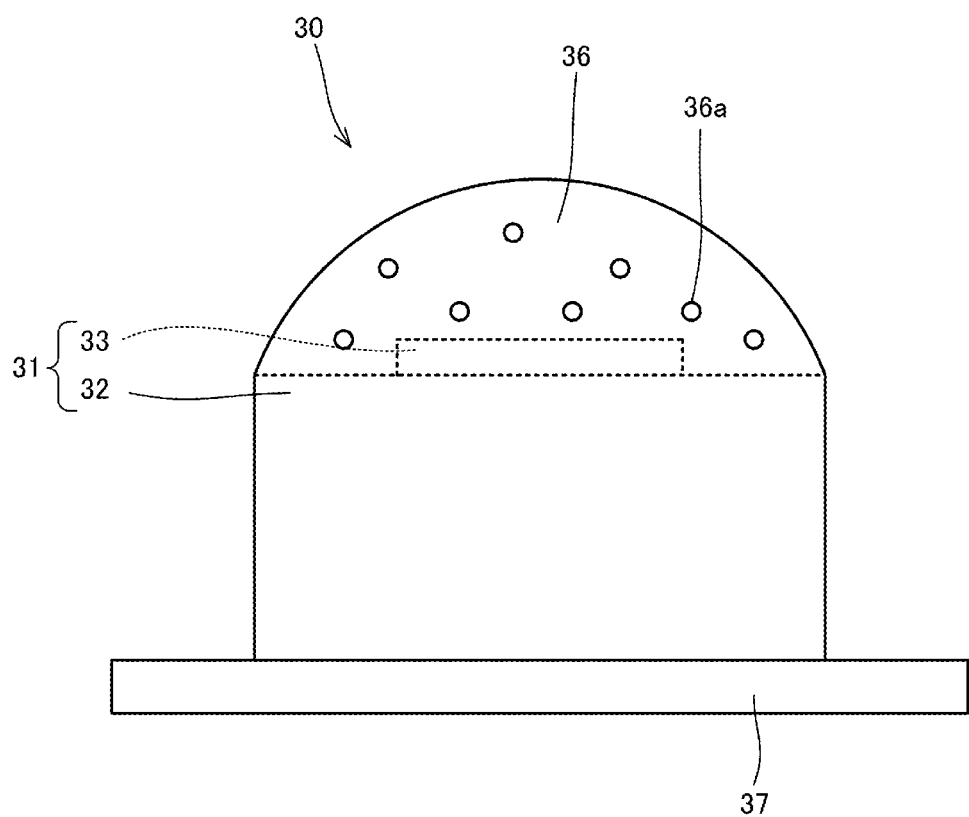
FIG. 10 is a side cross-section view showing a second conventional semiconductor light-emitting device in which a dome-shaped wavelength-converting layer is disposed on a top surface of a semiconductor light-emitting chip.
Figure 11:
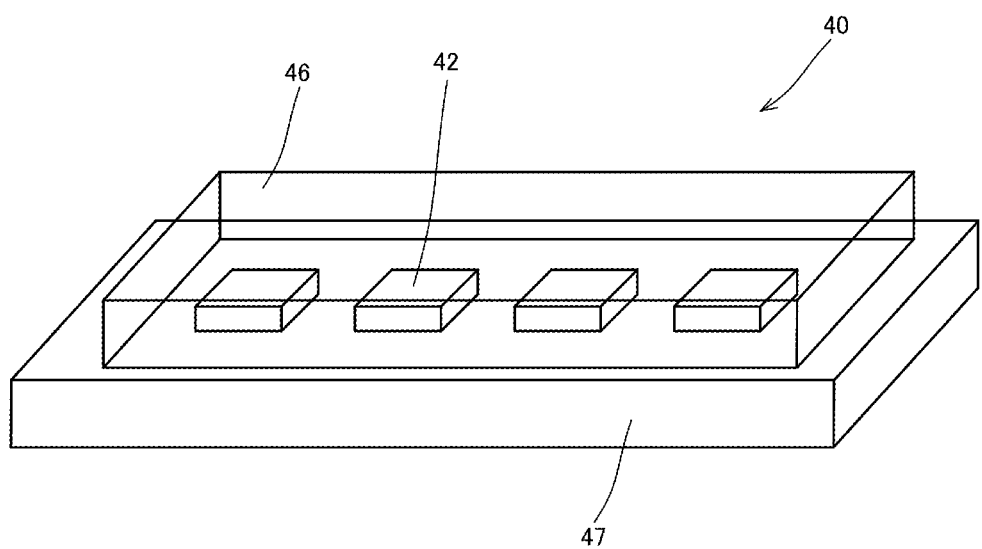
FIG. 11 is a perspective view showing a third conventional semiconductor light-emitting device including a wavelength-converting layer formed by a printing method.

Third exemplary embodiments will now be described with reference to FIGS. 8*a* to 8*c*. FIGS. 8*a* to 8*c* are side cross-section views showing third exemplary embodiments including a plurality of light-emitting chips of a semiconductor light-emitting device made in accordance with principles of the disclosed subject matter. The third embodiments of the semiconductor light-emitting device can include the plurality of light-emitting chips 11 mounted on the mounting surface of the base board 10 and a transparent plate 14, which is slightly larger than a whole of the combined top surfaces of the plurality of light-emitting chips 11 and which covers the whole of the top surfaces of the semiconductor light-emitting chips 11 via a wavelength converting layer 13.

A space between the top surfaces of the semiconductor light-emitting chips 11 and a bottom surface of the transparent plate 14 can be prescribed and/or maintained by a particle size of a spacer 13b disposed therebetween. A wavelength converting layer 13 including the particulate spacer 13b can be formed in the space between the top surfaces of the semiconductor light-emitting chips 11 and the bottom surface of the transparent plate 14.

When the plurality of the light-emitting chips 11 are mounted on the mounting surface of the base board 10, the top surfaces of the semiconductor light-emitting chips 11 may not have the same level with respect to each other due to an error associated with mounts. In this case, when the transparent plate 14 is mounted over the top surfaces of the semiconductor light-emitting chips 11 via the wavelength converting layer 13, the transparent plate 14 may be supported by a particle of the spacer 13b located on a highest top surface in the plurality of the light-emitting chips 11, and a thickness of the wavelength converting layer 13 may not be contributed by particles of the spacer 13b located on a lower top surface than the highest top surface in the light-emitting chips 11.

In addition, a base material and/or a phosphor 13a contained in the wavelength converting layer 13 may spread on upper portions and underneath bottom portions of the particles of the spacer 13b located on the lower top surface between the bottom surface of the transparent plate 14 and the lower top surface of the light-emitting chip 11. However, a problem may not be caused by this phenomenon. Although the particle of the spacer 13b located on the highest top surface can be operated as the particulate spacer 13b, the particles of spacer 13b located on the lower top surface may not be operated as the particulate spacer 13b in such a case, that is because a variation of the thickness of the wavelength converting layer 13 can be within a predetermined allowable limit when a height variability of the top surfaces of the light-emitting chips 11 is within an allowance.

A side slant surface 130 of an outer side surface of the wavelength converting layer 13 can be formed in a substantially linear shape connecting an end of the bottom surface of the transparent plate 14 to a bottom end of the outer side surface of the light-emitting chips 11 as shown in FIG. 1a, and also can be formed in a convex shape in an inward direction of the semiconductor light-emitting device as shown in FIGS. 8a to 8c. In this case, the side slant surface 130 can be formed in a curvature of 5 or less due to the same reason as described above with respect to the first embodiment. Additionally, the side slant surface 130 can be formed in a convex shape in an outward direction of the semiconductor light-emitting device as shown in FIG. 3b.

The wavelength converting layer 13 can include a convex shape 130a toward the transparent plate 14 in each space located between adjacent semiconductor light-emitting chips 11 as shown in FIGS. 8a and 8b. Thereby, variations of light intensities emitted from the light-emitting chips 11 can be reduced via the wavelength converting layer 13 and the transparent plate 14. In this case, the convex shape 130a of the wavelength converting layer 13 may extend and possibly contact the bottom surface of the transparent plate 14. A curvature of the convex shape 130 can be 5 or less, similar to the curvature of the side slant surface 130. A description in regard to other structures of the third embodiment is abbreviated because the other structures can be substantially the same as the first embodiment.

The semiconductor light-emitting device shown in FIGS. 8a-c can include a frame 16 located on the baseboard 10 and reflective material layer 15 located within the frame 16 such that the wavelength converting layer 13 and reflective material layer 15 can be configured as shown in FIG. 6 with respect to the remaining structures (i.e., with respect to the light emitting chips 11 baseboard 10 and transparent plate 14, etc.).

A manufacturing method for the third embodiment of the semiconductor light-emitting device shown in FIGS. 8a to 8c can be basically the same as that for the first embodiment shown in FIGS. 2a to 2c. In the structure shown in FIG. 8a, the uncured paste 13' can be equally applied on at least one of each top surface of the light-emitting chips 11 and each region of the transparent plate 14 covering each top surface of the light-emitting chips 11. The wavelength converting layer 13 can be formed so that the side slant surface 130 between the bottom surface of the wavelength converting layer 14 and the outer side surface of the light-emitting chips 11 facing the frame 16 can be formed in a prescribed shape.

However, when the wavelength converting layer 13 connects each space above or on light-emitting chips 11 to each of the spaces between the adjacent light-emitting chips as shown in FIGS. 8b and 8c, an amount of the uncured paste 13' applied on each top surface of the light-emitting chips 11 can vary so that a total amount of the uncured paste 13' becomes a predetermined amount.

More specifically, in the structure of the wavelength converting layer 13 shown in FIG. 8a, when the wavelength converting layer 13 is formed between the transparent plate 14 and the light-emitting chips 11 using the uncured paste 13', the uncured paste 13' can be disposed between the bottom surface of the transparent plate 14 and each top surface of the light-emitting chips 11 so that the uncured paste 13' can form in a cavity shape from each side surface of the light-emitting chips 11 to the bottom surface of the transparent plate 14.

In the structure of the wavelength converting layer 13 shown in FIG. 8b, the uncured paste 13' can connect each space on or above the light-emitting chips 11 to each of the spaces between the adjacent light-emitting chips 11, and can be formed in a convex shape in a direction of the transparent plate 14 in each of the spaces between the adjacent light-emitting chips 11. Then the wavelength converting layer 13 can be formed by solidifying the uncured paste 13' as shown in FIG. 8b.

In addition, in the third embodiments of the semiconductor light-emitting device shown in FIGS. 8a to 8c, the reflective material layer 15 can be disposed between the frame 16 and the semiconductor light-emitting device. In these cases, in process (e) for disposing the reflective material layer 15, in order to form the convex shape 130a so as to raise the reflective material layer 15 in each of the spaces between the adjacent light-emitting chips 11, a viscosity of the uncured reflective material 13' can be adjusted.

According to the third embodiments of the semiconductor light-emitting device, because the side slant surface 130 of the wavelength converting layer 15 can be formed from the outer side surface of the light-emitting chips 11 facing the frame 16 to the transparent plate 14, light emitted in crosswise direction of the light-emitting chips 11 can be reflected toward the transparent plate 14. Therefore, the third embodiments of the disclosed subject matter can provide semiconductor light-emitting devices that can emit light having a high light-emitting efficiency via the thin and uniform wavelength converting layer 13 including a high density of phosphor from a small light-emitting surface, which is the top surface of the transparent plate 14 that is slightly larger than the top surfaces of the light-emitting chips 11.

In addition, because the semiconductor light-emitting device of the third embodiment can prevent a reduction of light intensity between the adjacent light-emitting chips 11 by forming the convex shape 130a in each of the spaces between the adjacent light-emitting chips 11, the disclosed subject matter can provide semiconductor light emitting devices which can reduce a variation of a light intensity on the light-emitting surface.

The first embodiment having the structure of FIG. 1 of the disclosed subject matter made in accordance with the manufacturing method shown in FIGS. 3a to 3e is described. The manufacturing method for the first embodiment can include: preparing a base board 10 by mounting a flip chip type semiconductor light-emitting chip 11 having a square of 1 millimeter and a thickness of 100 micro meters emitting blue light thereon; preparing an uncured paste 13' made by adding YAG phosphor having a particle size of 15 micrometers at a rate of 60 weight percent as the phosphor 13a and a spherical bead of barium titanium series glass having a mean particle size of 41±2 micro meters and a variability of particle size of ±3 micro meters (Product No. GS40S of Nippon Electric Glass Co., Ltd.) at a rate of 5 weight percent as the particulate spacer 13b into a silicone resin, and by uniformly dispersing the phosphor 13a and the particulate pacer 13b in the silicone resin by mixing them; applying the uncured paste 13' of approximately $7.0 \times 10^{-4}$ ml on a top surface of the light-emitting chip 11; mounting a glass plate having a thickness of 0.1 mil meters and a square of 1.2 millimeters as the transparent plate 14 on the uncured paste 13', then the uncured paste 13' spreading between the top surface of the light-emitting chip 11 and the transparent plate 14 with its weight, and the transparent plate 14 supported over/by the light-emitting chip 11 via the particulate spacer 13b, thereby the uncured paste 13' (uncured wavelength converting layer 13) formed between the light-emitting chip 11 and the transparent plate 14, in which a thickness of the uncured paste 13' is prescribed by the particle size of the spacer 13b between the transparent plate 14 and the light-emitting chip 11; heating at 150 degrees centigrade for 4 hours to solidify the silicone resin of the uncured paste 13'; and finishing a semiconductor light emitting device having the structure of FIG. 1, which emits light having a substantially white color tone.

The second embodiment having the structure of FIG. 6 of the disclosed subject matter made in accordance with the manufacturing method shown in FIGS. 7a to 7e is described. The manufacturing method for the second embodiment can include: preparing the base board 10 and the uncured paste 13' as the same as the first embodiment; applying the uncured paste 13' of approximately $7.0 \times 10^{-4}$ ml on the top surface of the light-emitting chip 11; mounting the same glass plate as the first embodiment on the uncured paste 13' as the transparent plate 14, then the uncured paste 13' spreading between the top surface of the light-emitting chip 11 and the transparent plate 14 with its weight, and thereby the uncured paste 13' (uncured wavelength converting layer 13) formed between the light-emitting chip 11 and the transparent plate 14, in which a thickness of the uncured paste 13' is prescribed by the particle size of the spacer 13b between the transparent plate 14 and the light-emitting chip 11; heating at 150 degrees centigrade for 4 hours to solidify the silicone resin of the uncured paste 13'; attaching a ceramic ring as the frame 16 on the base board 10 via a silicone resin and solidifying the silicone resin at 150 degrees centigrade for 4 hours; disposing a silicone resin including a filler of $T_iO_2$ as the reflective material layer 15 between the frame 16 and both side surfaces of the wavelength converting layer 13 and the transparent plate 14, and solidifying the silicone resin of the reflective material layer 15 at 150 degrees centigrade for 4 hours; and finishing a semiconductor light emitting device having the structure of FIG. 6, which emits light having a substantially white color tone.

The third embodiment including the structure of FIG. 8a of the disclosed subject matter made in accordance with the above-described manufacturing method is described. The manufacturing method for the third embodiment can include: preparing a base board 10 by mounting two flip chip type semiconductor light-emitting chips 11 each having a square of 1 millimeter and a thickness of 100 micro meters emitting blue light at an interval of 200 micro meters thereon; applying the same uncured paste 13' of approximately $7.0 \times 10^{-4}$ ml as the first embodiment on each of top surfaces of the two light-emitting chips 11; mounting a glass plate having a thickness of 0.1 mil meters and a rectangular shape of 1.2×2.4 millimeters as the transparent plate 14 on the uncured paste 13', and the uncured paste 13' (uncured wavelength converting layer 13) formed between the light-emitting chips 11 and the transparent plate 14; heating at 150 degrees centigrade for 4 hours to solidify the silicone resin of the uncured paste 13'; attaching a ceramic ring as the frame 16 on the base board 10 via a silicone resin and solidifying the silicone resin at 150 degrees centigrade for 4 hours; disposing a silicone resin including a filler of $T_iO_2$ as the reflective material layer 15 between the frame 16 and both side surfaces of the wavelength converting layer 13 and the transparent plate 14, and solidifying the silicone resin of the reflective material layer 15 at 150 degrees centigrade for 4 hours; and finishing a semiconductor light emitting device including the structure of FIG. 8, which emits light having a substantially white color tone.

An exemplary comparative embodiment of the semiconductor light-emitting device made to evaluate the semiconductor light-emitting device of the disclosed subject matter is described. A manufacturing method for the comparative embodiment can include: preparing the same base board 10 as the first embodiment; preparing an uncured paste 13', which does not contain the particulate spacer 13b in the uncured paste 13' of the first embodiment; encapsulating the semiconductor light-emitting chip 11 on the base board with the uncured paste 13' via a mask having an opening for the semiconductor chip 11 by a stencil printing method and removing the mask; heating at 150 degrees centigrade for 4 hours to solidify the silicone resin of the uncured paste 13'; and finishing a semiconductor light emitting device having a wavelength converting layer, which has a thickness of 45 micro meters from the top surface of the semiconductor chip 11 and which emits light having a substantially white color tone.

According to 10 samples of the above-described comparative embodiment, a variation of thicknesses of the wavelength converting layers in 10 samples made by the printing method was ± approximately 15 percent. On the other hand, a variation of thicknesses of the wavelength converting layer in 10 samples made in accordance with the first embodiment having the structure of FIG. 1 was within ±5 percent, and thus it was verified that a variation of chromaticity values of the samples is very small. In addition to the small variability of the chromaticity values, the semiconductor light emitting device having such a structure may emit a wavelength-converted light having a similar chromaticity even between different manufacturing lots.

As described above, the disclosed subject matter can form a light-emitting surface in a small shape such that is slightly larger than the top surface of the semiconductor light-emitting chip 11, and can improve a light-emitting efficiency by forming the thin wavelength converting layer 13 including the phosphor 13a having a high density and by using the side slant surface 130 of the reflective material layer 15 or the wavelength converting layer 13 as a reflector for the light-emitting chip 11. In addition, even when a plurality of light-emitting chips 11 is mounted on the base board 10, a variation of a light intensity between the light-emitting chips 11 can be reduced. Thus, the disclosed subject matter can provide a semiconductor light-emitting device having a small light-emitting surface and a high light-emitting efficiency, which can be used for lighting units such as a vehicle headlight that controls light emitted from the light-emitting device using a reflector and/or a projector lens.

Moreover, the wavelength converting layer including the side slant surface 130 can be formed by disposing the uncured paste 13' between the transparent plate and the semiconductor light-emitting chip and by the weight of the transparent plate without a mechanical process. In addition, the side slant surface 130 of the reflective material layer can be formed by disposing the uncured transparent material on at least the side surface of the wavelength converting layer 13. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight. However, the semiconductor light-emitting device can incorporate various colored lights by combining the above-described semiconductor chip 11 with the wavelength converting layer 14 including at least one phosphor, and therefore can also be used as a light source device for various applications such as general lighting, a street light, stage lighting, traffic lights and the like using a small and simple optical member. In addition, it is conceivable that each of the different aspects and features of the different embodiments disclosed herein could be used interchangeably in and with the other disclosed embodiments. For example, the multiple chip embodiment could include slant surfaces 130 that are concave. In addition, one side of a device can include a slant surface 130 that is convex while another side of the device includes a slant surface 130 that is concave. In addition, it is contemplated that any different color chip or different wavelength material can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
   a base board having a mounting surface and a conductor pattern formed on the mounting surface;
   a semiconductor light-emitting chip having an end, a chip bottom surface, a top surface and a chip side surface, and including chip electrodes adjacent the chip bottom surface, and the top surface of the semiconductor light-emitting chip including the end of the semiconductor light-emitting chip;
   a transparent plate having an end, a plate side surface and a plate bottom surface formed in a substantially planar shape, and located over the top surface of the semiconductor light-emitting chip so that the plate bottom surface of the transparent plate covers the top surface of the semiconductor light-emitting chip, and the plate bottom surface of the transparent plate including the end of the transparent plate, wherein the end of the transparent plate is located at an outer side of the end of the semiconductor light-emitting chip in plan view; and
   a wavelength converting layer having a thickness and a layer side surface being disposed between the transparent plate and the semiconductor light-emitting chip, and the wavelength converting layer covering at least a part of the chip side surface of the semiconductor light-emitting chip, the layer side surface of the wavelength converting layer forming a slant surface that extends from the chip side surface of the semiconductor light-emitting chip to the plate side surface of the transparent plate, the wavelength converting layer including at least one phosphor having a phosphor particle size and a particulate spacer having a spacer particle size that is larger than the phosphor particle size of the at least one phosphor, wherein the thickness of the wavelength converting layer is defined between the top surface of the semiconductor light-emitting chip and the plate bottom surface of the transparent plate and is maintained by supporting the plate bottom surface of the transparent plate using the particulate spacer located on the top surface of the semiconductor light-emitting chip; and;
   a reflective material layer covering the slant surface of the wavelength converting layer.

2. The semiconductor light-emitting device according to claim 1, further comprising a plurality of semiconductor light-emitting chips.

3. The semiconductor light-emitting device according to claim 1, wherein the slant surface of the wavelength converting layer is formed in a cup shape so as to enlarge from the chip side surface of the semiconductor light-emitting chip toward the plate side surface of the transparent plate.

4. The semiconductor light-emitting device according to claim 1, further comprising:
   a frame located adjacent the mounting surface of the base board so as to surround the semiconductor light-emitting chip and the wavelength converting layer, and wherein the reflective material layer having a reflective side slant surface disposed at least between the frame and both the layer side surface of the wavelength converting layer and the plate side surface of the transparent plate, and the reflective side slant surface contacts with the layer side surface of the wavelength converting layer.

5. The semiconductor light-emitting device according to claim 4, wherein the slant surface of the wavelength converting layer is formed by using a surface tension of an uncured material of the wavelength converting layer.

6. The semiconductor light-emitting device according to claim 1, wherein the particulate spacer includes at least one of an oxide silicon particle and a glass bead, and the particle size of the particulate spacer is 10 to 100 micro meters.

7. A semiconductor light-emitting device comprising:
   a base board having a mounting surface and a conductor pattern formed on the mounting surface;
   a plurality of semiconductor light-emitting chips each having a chip bottom surface, a top surface and an outer side surface located in an outward direction of each of the semiconductor light-emitting chips, and each of the semiconductor light-emitting chips including chip electrodes adjacent the chip bottom surface, wherein the plurality of semiconductor light-emitting chips are located adjacent each other;

a transparent plate having a plate side surface and a plate bottom surface formed in a substantially planar shape, and located over the top surface of each of the semiconductor light-emitting chips so that the plate bottom surface of the transparent plate covers the top surface of each of the semiconductor light-emitting chips, wherein the plate bottom surface of the transparent plate is larger than a whole of combined top surfaces of the plurality of light-emitting chips; and a wavelength converting layer having a thickness, a layer side surface and a layer bottom surface facing the mounting surface of the base board, and being disposed between the transparent plate and the semiconductor light-emitting chips, and the wavelength converting layer covering at least a part of the outer side surface of each of the semiconductor light-emitting chips so that the layer side surface of the wavelength converting layer forming a slant surface that extends from the outer side surface of each of the semiconductor light-emitting chips to the plate side surface of the transparent plate, the wavelength converting layer including at least one phosphor having a phosphor particle size and a particulate spacer having a spacer particle size that is larger than the phosphor particle size of the at least one phosphor, wherein the thickness of the wavelength converting layer is defined between the top surface of each of the semiconductor light-emitting chips and the plate bottom surface of the transparent plate and is maintained by supporting the plate bottom surface of the transparent plate using the particulate spacer located on the top surface of each of the semiconductor light-emitting chips; and;

a reflective material layer covering the slant surface of the wavelength converting layer.

8. The semiconductor light-emitting device according to claim 7, further comprising:

a frame located adjacent the mounting surface of the base board so as to surround the semiconductor light-emitting chips and the wavelength converting layer while facing the outer side surface of the at least one of the semiconductor light-emitting chips, and wherein the reflective material layer having a reflective side slant surface disposed at least between the frame and both the layer side surface of the wavelength converting layer and the plate side surface of the transparent plate, and the reflective side slant surface contacts with the layer side surface of the wavelength converting layer.

9. A method for manufacturing the semiconductor light-emitting device according to claim 8, comprising:

providing the base board;

connecting each of the chip electrodes of the semiconductor light-emitting chips to a respective portion of the conductor pattern of the base board;

disposing an uncured paste between the plate bottom surface of the transparent plate and the outer side surface of the at least one of the semiconductor light-emitting chips so as to extend from the outer side surface of the at least one of the semiconductor light-emitting chips toward the plate bottom surface of the transparent plate; and disposing an uncured reflective material at least between the frame and both the layer side surface of the wavelength converting layer and the plate side surface of the transparent plate and between the chip bottom surface of the at least one of the semiconductor light-emitting chips and the mounting surface of the base board.

10. The semiconductor light-emitting device according to claim 7, wherein the particulate spacer includes at least one of an oxide silicon particle and a glass bead, and the spacer particle size of the particulate spacer is 10 to 100 micro meters.

11. The semiconductor light-emitting device according to claim 7, wherein the wavelength converting layer contains the at least one phosphor of at least 50 weight percent.

12. The semiconductor light-emitting device according to claim 7, wherein the plurality of semiconductor light-emitting chips includes a blue light-emitting chip and the at least one phosphor of the wavelength converting layer is selected from the group consisting of a yellow phosphor, and two phosphors including a red phosphor and a green phosphor.

13. The semiconductor light-emitting device according to claim 7, wherein the plurality of semiconductor light-emitting chips includes an ultraviolet light-emitting chip and the at least one phosphor of the wavelength converting layer includes at least one of a red phosphor, a green phosphor, and a blue phosphor.

14. The semiconductor light-emitting device according to claim 7, wherein the layer bottom surface of the wavelength converting layer is formed in a convex shape extending in a direction toward the transparent plate in at least one space between adjacent semiconductor light-emitting chips.

15. The semiconductor light-emitting device according to claim 7, wherein the layer bottom surface of the wavelength converting layer is located at a substantially same level as a level of the chip bottom surface of at least one of the semiconductor light-emitting chips in at least one space between adjacent semiconductor light-emitting chips.

16. A method for manufacturing the semiconductor light-emitting device according to claim 7, comprising:

providing the base board;

connecting each of the chip electrodes of the semiconductor light-emitting chips to a respective portion of the conductor pattern of the base board;

disposing an uncured paste between the plate bottom surface of the transparent plate and the outer side surface of the at least one of the semiconductor light-emitting chips so as to extend from the outer side surface of the at least one of the semiconductor light-emitting chips toward the plate bottom surface of the transparent plate; and forming the wavelength converting layer having a thickness between the plate bottom surface of the transparent plate and the top surface of the at least one of the semiconductor light-emitting chips by solidifying the uncured paste.

17. The semiconductor light-emitting device according to claim 7, wherein the slant surface of the wavelength converting layer is formed in a cup shape so as to enlarge from the outer side surface of each of the semiconductor light-emitting chips toward the plate side surface of the transparent plate.

18. The semiconductor light-emitting device according to claim 7, wherein the slant surface of the wavelength converting layer is formed by using a surface tension of an uncured material of the wavelength converting layer.

19. The semiconductor light-emitting device according to claim 7, wherein the slant surface of the wavelength converting layer is formed by using a surface tension of an uncured material of the wavelength converting layer.

* * * * *